(12) United States Patent
van Den Broeke et al.

(10) Patent No.: US 8,495,529 B2
(45) Date of Patent: *Jul. 23, 2013

(54) METHOD, PROGRAM PRODUCT AND APPARATUS FOR MODEL BASED SCATTERING BAR PLACEMENT FOR ENHANCED DEPTH OF FOCUS IN QUARTER-WAVELENGTH LITHOGRAPHY

(75) Inventors: Douglas van Den Broeke, Sunnyvale, CA (US); Jang Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 869 days.

This patent is subject to a terminal disclaimer.

(21) Appl. No.: 12/613,344

(22) Filed: Nov. 5, 2009

(65) Prior Publication Data

US 2010/0047699 A1 Feb. 25, 2010

Related U.S. Application Data

(63) Continuation of application No. 11/208,015, filed on Aug. 22, 2005, now Pat. No. 7,620,930.

(60) Provisional application No. 60/603,560, filed on Aug. 24, 2004.

(51) Int. Cl.
*G06F 17/50* (2006.01)

(52) U.S. Cl.
USPC ............... 716/55; 716/50; 716/51; 716/52; 716/53; 716/54; 430/5; 430/30

(58) Field of Classification Search
USPC ................... 716/50–55; 430/5, 30
See application file for complete search history.

(56) References Cited

U.S. PATENT DOCUMENTS 5,229,230 A 7/1993 Kamon
5,242,770 A 9/1993 Chen et al.
(Continued)

FOREIGN PATENT DOCUMENTS

EP 1237046 9/2002
EP 1239331 9/2002
(Continued)

OTHER PUBLICATIONS

Christoph Dolainsky, et al., "Simulation based method for sidelobe suppression," Optical Microlithography XIII, Proceedings of SPIE, 2000, pp. 1156-1162, vol. 4000.

(Continued)

*Primary Examiner* — Nghia Doan
(74) *Attorney, Agent, or Firm* — Pillsbury Winthrop Shaw Pittman LLP (57) ABSTRACT

A method of generating a mask having optical proximity correction features. The method includes the steps of: (a) obtaining a desired target pattern having features to be imaged on a substrate; (b) determining a first focus setting to be utilized when imaging the mask; (c) determining a first interference map based on the target pattern and the first focus setting; (d) determining a first seeding site representing the optimal placement of an assist feature within the mask relative to a feature to be imaged on the basis of the first interference map; (e) selecting a second focus setting which represents a predefined amount of defocus relative to the first focus setting; (f) determining a second interference map based on the target pattern and the second focus setting; (g) determining a second seeding site representing the optimal placement of an assist feature within the mask relative to the feature to be imaged on the basis of the second interference map; and (h) generating an assist feature having a shape which encompasses both the first seeding site and the second seeding site.

19 Claims, 8 Drawing Sheets

U.S. PATENT DOCUMENTS

| | | | |
|---|---|---|---|
| 5,447,810 | A | 9/1995 | Chen et al. |
| 5,682,323 | A | 10/1997 | Pasch et al. |
| 5,705,301 | A | 1/1998 | Garza et al. |
| 5,895,741 | A | 4/1999 | Hasegawa et al. |
| 5,969,441 | A | 10/1999 | Loopstra |
| 6,046,792 | A | 4/2000 | Van Der Werf et al. |
| 6,214,497 | B1 | 4/2001 | Stanton |
| 6,223,139 | B1 | 4/2001 | Wong et al. |
| 6,303,253 | B1 | 10/2001 | Lu |
| 6,355,382 | B1 | 3/2002 | Yasuzato et al. |
| 6,413,684 | B1 | 7/2002 | Stanton |
| 6,519,760 | B2 | 2/2003 | Shi et al. |
| 6,703,167 | B2 | 3/2004 | LaCour |
| 6,777,141 | B2 | 8/2004 | Pierrat |
| 6,787,271 | B2 | 9/2004 | Cote et al. |
| 6,792,591 | B2 | 9/2004 | Shi et al. |
| 6,807,662 | B2 | 10/2004 | Toublan et al. |
| 7,247,574 | B2 | 7/2007 | Broeke et al. |
| 7,376,930 | B2 * | 5/2008 | Wampler et al. ............... 716/54 |
| 7,550,235 | B2 * | 6/2009 | Shi et al. ............................ 430/5 |
| 7,620,930 | B2 * | 11/2009 | Van Den Broeke et al. .... 716/53 |
| 2002/0083410 | A1 | 6/2002 | Wu et al. |
| 2002/0152452 | A1 | 10/2002 | Socha |
| 2002/0157081 | A1 | 10/2002 | Shi et al. |
| 2003/0228541 | A1 | 12/2003 | Hsu et al. |
| 2004/0122636 | A1 | 6/2004 | Adam |
| 2004/0209170 | A1 | 10/2004 | Van Den Broeke et al. |
| 2005/0130047 | A1 | 6/2005 | Kroyan |
| 2005/0142449 | A1 | 6/2005 | Shi et al. |

FOREIGN PATENT DOCUMENTS

| | | |
|---|---|---|
| EP | 1439419 | 7/2004 |
| EP | 1439420 | 7/2004 |
| WO | WO02/03140 | 1/2002 |
| WO | WO 03/054626 | 7/2003 |
| WO | WO 2004/008244 | 1/2004 |

OTHER PUBLICATIONS

Kyoji Nakajo, et al., "Auxiliary pattern generation to cancel unexpected images at sidelobe overlap regions in attenuated phase-shift masks," Part of the SPIE Symposium on Photomask and X-Ray Mask Technology VI, Sep. 1999, SPIE vol. 3748.

Nicolas Bailey Cobb, "Fast Optical and Process Proximity Correction Algorithms for Integrated Circuit Manufacturing," Ph.D. dissertation, Spring 1998, pp. 35-72, University of California at Berkeley.

Fung Chen, et al., "Practical I-Line OPC Contact Masks for Sub-0.3Micron Design Rule Application: Part 1—OPC Design Optimization," pp. 181-201.

J.A. Torres, et al., "Contrast-Based Assist Feature Optimization," Optical Microlithography XV, 2002, pp. 179-187, Proceedings of SPIE, vol. 4691, SPIE.

Olivier Toublan, et al., "Fully Automatic Side Lobe Detection and Correction Technique for Attenuated Phase Shift Masks," Optical Microlithography XIV, 2001, pp. 1541-1547, Proceedings of SPIE, vol. 4346, SPIE.

Michael S. Yeung, "Extension of the Hopkins theory of partially coherent imaging to include thin-film interference effects," Optical/Laser Microlithography VI, 1993, pp. 452-463, SPIE, vol. 1927.

Douglas Van Den Broeke, et al., "Near 0.3 $k_1$ Full Pitch Range Contact Hole Patterning Using Chromeless Phase Lithography (CPL)," Proceedings of the SPIE, Sep. 9, 2003, pp. 297-308, vol. 5256, SPIE.

Australian Search Report issued in corresponding Singapore Patent Application No. SG 200505331-9, dated Mar. 2, 2007.

Broeke, et al., "Near 0.3 k1 Full Pitch Range Contact Hole Patterning Using Chromeless Phase Lithography (CPL)", Proc. of the SPIE, vol. 5256, Sep. 9, 2003, pp. 297-308.

Broeke et al., "Application of CPL With Interference Mapping Lithography to Generate Random Contact Reticle Designs for the 65NM Node", Proc. of the SPIE, vol. 5446, No. 1, Apr. 14, 2004, pp. 550-559.

Toublan, O., et al., "Fully Automatic Side Lobe Detection and Correction Technique for Attenuated Phase Shift Masks", Proc. of the SPIE, vol. 4346, No. Part 1-2, 2001, pp. 1541-1547.

* cited by examiner

An isolated contact hole feature

FIG. 5a

An isolated contact hole feature, with SB seeding sites located

FIG. 5b

The growth of SB in X and Y is limited by the maximum allowable intensity (<0.15), as shown in the dotted intensity contour lines.

FIG. 5c

An isolated contact hole feature, with SB seeding sites located. The SB is then formed.

When with other neighboring contact hole features, the growth of SB is also limited by the maximum allowable intensity, as shown in the dotted lines that represent the maximum intensity contour can be achieved.

Fig. 7

A) Interference map in one NA and illumination setting. Middle one is

FIG. 8a

B) Weak feature can either be improved with better optical settings or with a design

METHOD, PROGRAM PRODUCT AND APPARATUS FOR MODEL BASED SCATTERING BAR PLACEMENT FOR ENHANCED DEPTH OF FOCUS IN QUARTER-WAVELENGTH LITHOGRAPHY

CROSS-REFERENCE TO RELATED APPLICATIONS

This patent application claims priority to U.S. provisional patent application No. 60/603,560, filed on Aug. 24, 2004, and U.S. patent application Ser. No. 11/208,015, filed Aug. 22, 2005, now U.S. Pat. No. 7,620,930, both of which applications are incorporated herein by reference in their entirety.

FIELD OF THE INVENTION

The technical field of the present invention relates generally to a method, program product and apparatus for generation and placement of assist features within a target pattern to provide OPC and improve overall imaging performance.

BACKGROUND OF THE INVENTION

Lithographic apparatuses can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

"Assist features" in masks may be used to improve the image projected onto the resist and ultimately the developed device. Assist features are features that are not intended to appear in the pattern developed in the resist but are provided in the mask to take advantage of diffraction effects so that the developed image more closely resembles the desired circuit pattern. Assist features are generally "sub-resolution" or "deep sub-resolution," meaning that they are smaller in at least one dimension than the smallest feature in the mask that will actually be resolved on the wafer. Assist features may have dimensions defined as fractions of the critical dimension. In other words, because the mask pattern is generally projected with a magnification of less than 1, e.g., ¼ or ⅕, the assist feature on the mask may have a physical dimension larger than the smallest feature on the wafer.

Of course, one of the goals in integrated circuit fabrication is to faithfully reproduce the original circuit design on the wafer (via the mask), which is improved with the use of assist features. Placement of these assist features generally follows a pre-defined set of rules. Following this method, designers determine how to bias a line, for example, and placement of assist features is determined in accordance with a set of predetermined rules. When creating the set of rules, test masks are exposed to different illumination settings and NA settings, which are repeated. Based on the set of test masks, a set of rules is created for assist feature placement.

However, these rules are generated based on a one-dimensional analysis or a one-and-a-half-dimensional analysis. Rules generated utilizing a one-dimensional analysis are based on an analysis of parallel lines. Rules generated utilizing a one-and-a-half-dimensional analysis take into consideration spacing between two parallel lines, line width and lines in the vicinity of the parallel lines. The one-and-half-dimensional approach is often useful for non-uniform pitch between parallel lines. Obviously, the more factors considered, the more complex the rules become.

The rules-based approach does not adapt itself well to complicated designs where a two-dimensional analysis is preferred. A two-dimensional analysis is based on all of the factors considered in the one-dimensional analysis and the one-and-a-half dimensional analysis, but is further based on a full analysis of the surroundings, i.e., an analysis of the full design layout or any portion thereof. As a result, rules based on a two-dimensional analysis are very difficult to formulate and express, and generally lead to very complicated multi-dimensional matrices. Often designers prefer to use a one-dimensional or one-and-a-half dimensional approach.

In U.S. Pat. No. 7,247,574, which is hereby incorporated by reference in its entirety, the applicants disclosed a simple method for generating assist features which takes into account a full analysis of the surroundings of the features to be imaged. More specifically, the applicants disclosed a method for utilizing an interference map to identify "seeding" sites which define where to place assist features or scattering bars (SB) within the mask design. While this method allows for the reliable generation of SB for the full-chip data processing, the lithography printing performance utilized when generating the interference map is assumed to be the best focus setting.

However, for 1C design rules (expressed in half feature pitch) beyond one-third of illumination wavelength, λ, such as 45 nm and 32 nm technology nodes, conventional optics (numerical aperture, or NA<1) can no longer attain sufficient resolution and the desired depth of focus (DOF) for lithography manufacturing. Hyper NA optics (i.e. NA>1) or a lens in the exposure tool with numerical aperture greater than 1.0 have been proposed for 1C manufacturing. In theory, hyper NA can be achieved when the printing medium is not under air (with refraction index, n, around 1.0) but under a medium, such as water, that has a refraction, n, greater than the one in air, or n>1.0.

Using immersion lithography with hyper NA enables the printing of features at one-fourth of illumination wavelength, per the following equation:

$$\text{Resolution (or half-pitch CD)} = k_1[(\lambda/n)/\text{NA}] \quad (1)$$

Assuming $k_1 \sim 0.3$, achievable using phase-shifted mask (PSM) together with optical proximity correction (OPC), 193 nm exposure wavelength, immersion with water (n=1.43 for 193 nm), with NA=1.2, it is theoretically feasible to print half pitch feature CD~33 nm. The corresponded DOF can be calculated as:

$$\text{DOF} = k_2[(\lambda)*(n)/(\text{NA})^2] \quad (2)$$

Given the same printing condition, for $k_2 \sim 1.0$ that is typically assumed for printing lines and spaces, the theoretical DOF expected is about 190 nm, or less than 0.2 µm. This is barely adequate from the point of view of focal plane leveling capability limit with advanced mechanical wafer stage.

For printing a contact hole mask, the typical $k_2$ may be half of the achievable one for printing lines and spaces. At $k_2 \sim 0.5$, the estimated DOF is no better than 0.1 µm, which is not good. Using linear polarized illumination perhaps can improve $k_2$ since it can enhance aerial image contrast for the directional ID features, such as lines and spaces. However, contact hole patterns are more or less a type of 2D structure.

Thus, as the desired critical dimensions (CD) of features continue to decrease, it is necessary to prevent the degradation of the DOF so as to allow the printing of features having such reduced CDs in a practical manufacturing process.

SUMMARY OF THE INVENTION

In view of the foregoing, it is an object of the present invention to provide a method which optimizes the placement and shape of SBs within the mask design so as to enhance the DOF and address the aforementioned problems.

More specifically, the present invention relates to a method of generating a mask having optical proximity correction features disposed therein in a manner so as to optimize DOF performance. The method includes the steps of: (a) obtaining a desired target pattern having features to be imaged on a substrate; (b) determining a first focus setting to be utilized when imaging the mask; (c) determining a first interference map based on the target pattern and the first focus setting; (d) determining a first seeding site representing the optimal placement of an assist feature within the mask relative to a feature to be imaged on the basis of the first interference map; (e) selecting a second focus setting which represents a predefined amount of defocus relative to the first focus setting; (f) determining a second interference map based on the target pattern and the second focus setting; (g) determining a second seeding site representing the optimal placement of an assist feature within the mask relative to the feature to be imaged on the basis of the second interference map; and (h) generating an assist feature having a shape which encompasses both the first seeding site and the second seeding site.

The method of the present invention provides important advantages over the prior art. Most importantly, the present invention provides an OPC assist feature placement technique that enhances the resulting depth of focus even when imaging features having dimensions on the order of a quarter of the wavelength of the imaging system.

Moreover, the present invention provides a model-based method for determining where, to place assist features within the design, thereby eliminating the need for experienced mask designers to perform OPC, and also substantially reducing the time required to determine an acceptable OPC solution.

Another advantage of the present invention is that it provides a model-based system for determining the optimal (i.e., maximum) size of the assist features, thereby further enhancing the resulting OPC performance.

In yet another advantage, the present invention provides a simple method for identifying whether or not each of the features of the target pattern to be imaged are "strong" features that will readily print within design tolerance, or if they are "weak" features that will likely require further OPC treatment to print with design tolerance.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

The invention itself, together with further objects and advantages, can be better understood by reference to the following detailed description and the accompanying drawings.

DETAILED DESCRIPTION OF THE PREFERRED EMBODIMENTS

As explained in more detail below, the OPC SB placement technique of the present invention operates to enhance the resulting depth of focus even when imaging features having dimensions on the order of a quarter of the wavelength of the imaging system. To summarize the present invention, instead of determining placement of the assist features (SBs) based on a single focal plane, typically the best focal plane, the process of the present invention determines optimal assist feature placement based on multiple focal planes (i.e., multiple defocus settings. It has been determined that the optimum assist feature placement sites (also referred to as seeding sites) for each subsequent de-focus setting is slightly different from the previous one. Depending on the illumination and the location and shape of the neighboring features or the surrounding environment within the optical interference range, the optimum seeding sites for the assist features "move" when determined under a series of defocus settings. At each corresponding assist feature seeding site, placement of an assist feature at the given seeding site produces the optimal printing performance for the particular defocus setting. As such, in order to enhance the overall DOF, it is necessary to place assist features in all of the seeding sites. This can be accomplished by tracing the series of optimum seeding sites determined for the various defocus settings and then grouping the seeding sites together so as to form a final assist feature structure that encompasses all of the seeding sites. The resulting single assist feature functions to optimize DOF performance for the imaging system.

Figure 1:
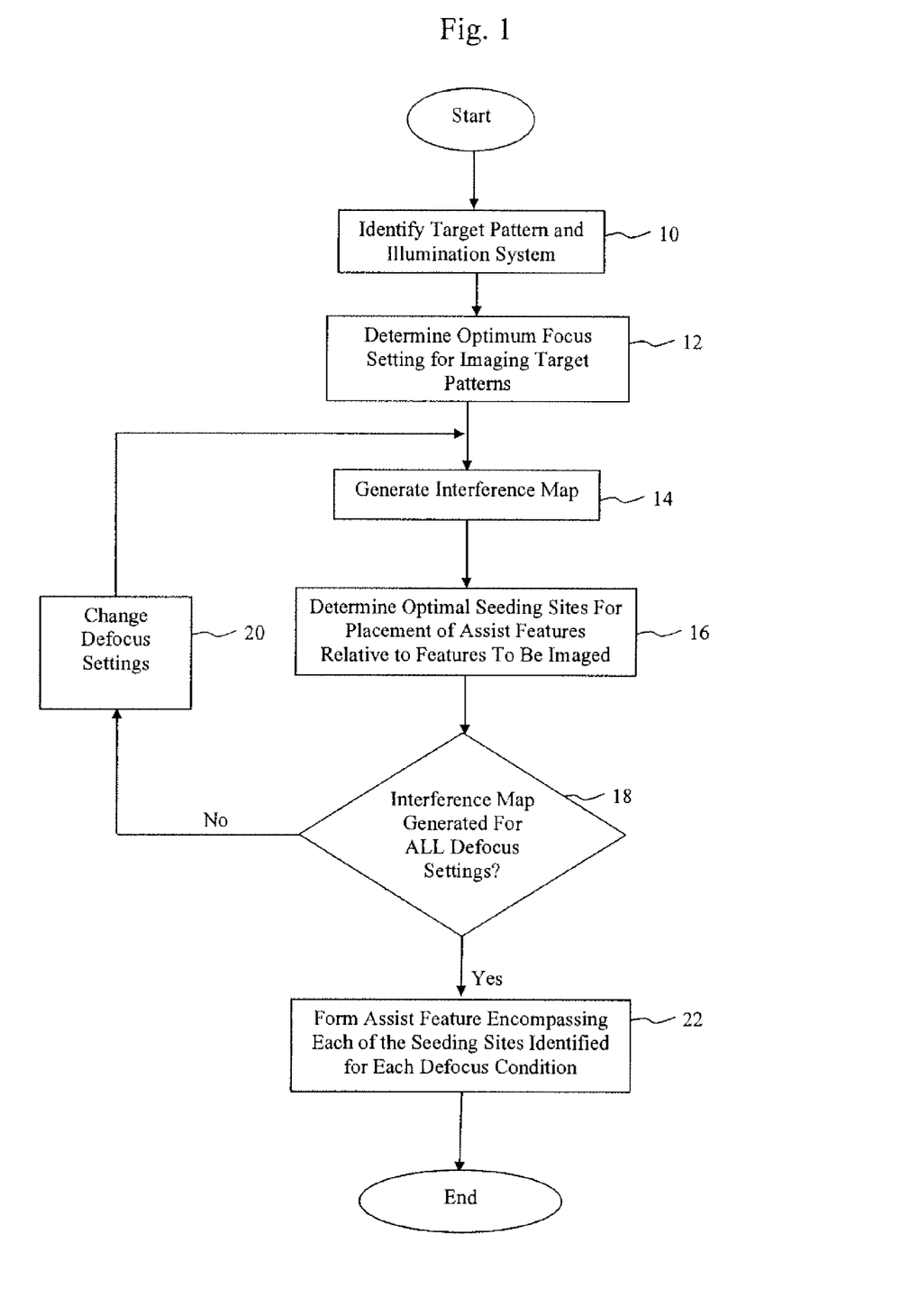
FIG. 1 is an exemplary flowchart illustrating the method of applying assist features to a mask pattern in accordance with a first embodiment of the present invention.
Figure 2A:
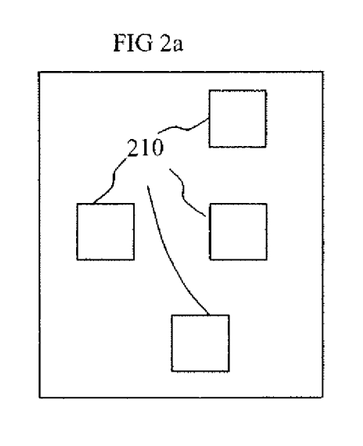
FIG. 2a-2d illustrate an example of applying assist features to a contact hole in accordance with the process of the first embodiment of the present invention.
Figure 2B:
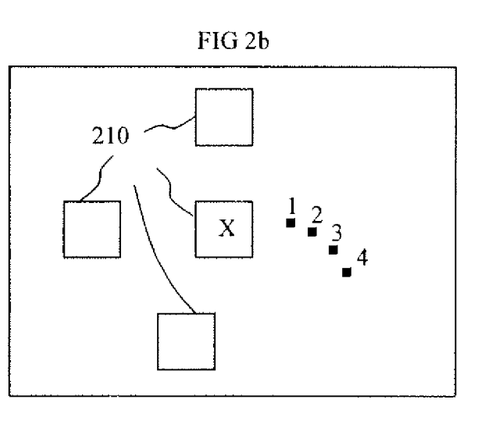

FIG. 1 is an exemplary flowchart illustrating the method of applying assist features to a mask pattern in accordance with a first embodiment of the present invention. The first step (Step 10) in the process is to identify the target mask pattern and illumination system and settings to be utilized to image the pattern. An exemplary target pattern comprising contact holes 210 is shown in FIG. 2a. The next step (Step 12) in the process is to determine the optimal focus setting for imaging the target pattern utilizing the given imaging system. As is known, the optimum focus setting can be determined either by a calibration or simulation process. The next step in the process (Step 14) is to generate an interference map (IM) for the target pattern utilizing the optimum focus setting. As noted above, the interference map can be generated in the manner disclosed in U.S. Pat. No. 7,247,574. Once the interference map is generated, it is utilized to determine the optimal seeding sites for the assist features relative to each of the features in the target pattern (Step 16) for the given focus setting. Referring to FIG. 2b, for the contact hole "x", the optimal seed site for the assist feature at the optimal focus condition is indicated by location "1" (which as noted above is determined by analyzing the interference map). It is noted that while the example illustrated in FIG. 2b only depicts the foregoing process being applied to a single contact hole, in an actual implementation the assist features would be disposed adjacent to numerous contact holes.

Continuing, the next step in the process is to vary the defocus setting, recompute the interference map for new defocus setting and determine the optimal seeding sites for the assist features for the new defocus setting. Typically, the resulting interference map will change as the defocus setting changes, and therefore the optimal placement of the assist feature changes as the defocus setting changes. It is noted that the number of defocus settings for which an interference map should be calculated is a minimum of two. However, if a greater the number of defocus settings are considered, a more optimal result may be obtained. Typically, three or four defocus settings would be considered adequate. The variation between the defocus setting is determined, for example, in accordance with the NA of the imaging system being utilized. As one example, assuming an NA of 0.85, increments of 0.2 um for the defocus adjustment would be typical. Assuming an NA of 0.93, increments of 0.15 um would be typical. It is noted that the foregoing numbers are merely exemplary in nature, and are not intended to be limiting.

The foregoing process is depicted in Steps 18 and 20 of FIG. 1. Specifically, once the optimal seeding sites for the assist features are determined for the best focus condition, the process proceeds to Step 18 where it is determined if an interference map needs to be generated for another defocus setting. If yes, the process proceeds to Step 20, where the defocus setting is adjusted, and then the process proceeds back to Step 14, where the interference map is recomputed utilizing the new defocus setting. The process then proceeds again to Step 16 where the optimal seeding sites for the assist features for the new defocus setting is determined. This loop is repeated until all of the defocus settings are processed.

Referring again to FIG. 2b, the result of the foregoing process is depicted therein. Specifically, in the given example, as noted above, location "1" represents the seeding site for the assist feature for contact "X" at best focus (i.e., defocus equals 0 um). Location "2" represents the seeding site for the assist feature for contact "X" at a first defocus (i.e., defocus equals 0.075 um). Location "3" represents the seeding site for the assist feature for contact "X" at a second defocus (i.e., defocus equals 0.150 um). Location "4" represents the seeding site for the assist feature for contact "X" at a third defocus (i.e., defocus equals 0.225 um).

Figure 2C:
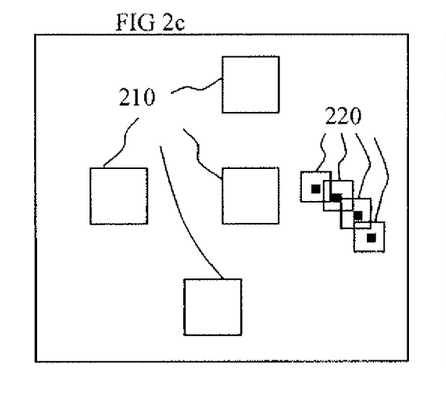
Figure 2D:
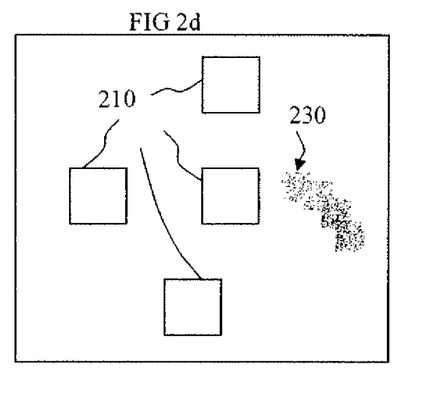

Once the seeding sites are determined for the defocus conditions under consideration, the next step (Step 22) in the process is to formed an assist feature encompassing each of the seeding sites identified for each of the defocus conditions. This result assist feature represents the assist feature to be utilized in the actual mask design. Referring to FIG. 2c, in the given embodiment, the assist feature is created by forming small square assist features 220 around each seeding site identified in the foregoing process. The small squares 220 are then grouped together to form one assist feature 230 as shown in FIG. 2d. It is noted that the finer the increments when varying the defocus settings, the resulting assist feature will exhibit less of a stair-step shape. It is also noted that while the given embodiment illustrates the assist feature being formed by a group of square features, it is possible to utilize any type of shape to form the final assist feature, with the restriction being that the all of the seeding sites should be encompassed by the assist feature and the assist feature must remain sub-resolution.

Figure 3:
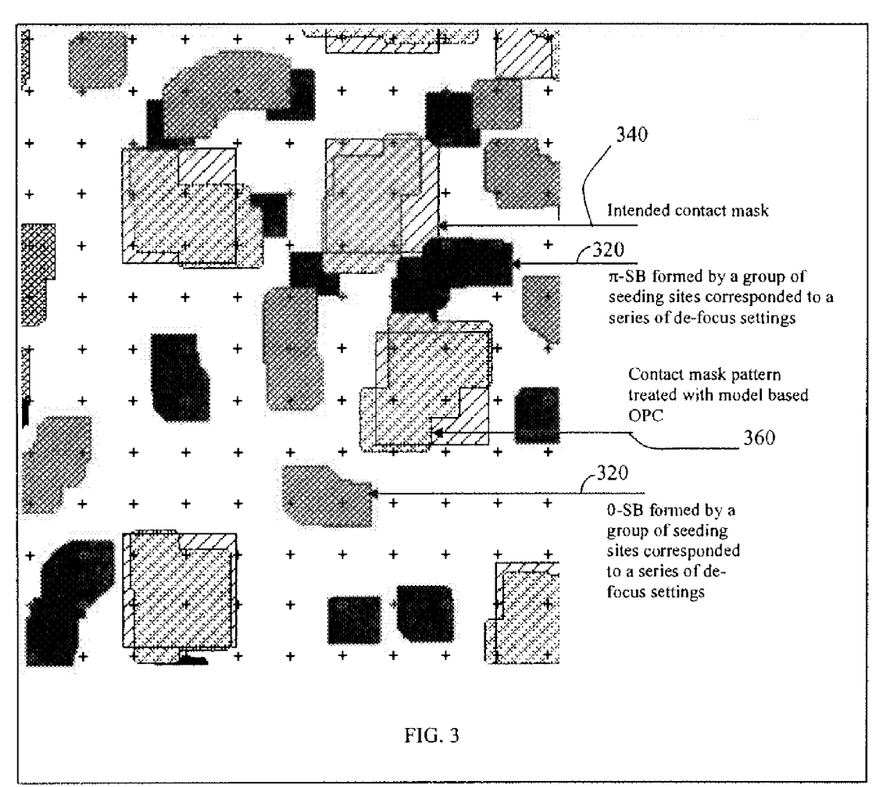
FIG. 3 illustrates an example of the result of utilizing the foregoing process to place assist features within a mask pattern.

FIG. 3 illustrates an actual example of the result of utilizing the foregoing process to place assist features within a mask pattern. Referring to FIG. 3, elements 320 represent SBs (i.e., assist features) formed to encompass a group of seeding sites in the manner set forth above, elements 340 represent the intended contact holes, and elements 360 represent the intended contact holes modified/treated with OPC.

Finally, it is noted that as disclosed in U.S. Pat. No. 7,247,574, it is possible to place assist features in either one of or both constructive areas of interference or destructive areas of interference. For placement of assist features in areas of constructive interference, the assist feature would be formed so as to have the same phase relative to the contact hole to be imaged, whereas for placement of assist features in areas of destructive interference, the assist feature would be formed so as to have a π-phase shift relative to the contact hole to be imaged. Both types of assist features are shown in FIG. 3.

In a second embodiment of the present invention, a process is disclosed for optimizing the size and shape of the assist features disposed in the target pattern. As is known, for most robust assist feature performance, it is desirable to form the assist features as large as possible. Moreover, larger assist feature dimensions result in an easier mask manufacturing process. However, as noted above, the assist feature must not be printable under nominal printing conditions for the CD target features. Known prior art methods typically utilized a traditional rule-based approach to define the size of the assist feature, where X & Y size limits where predefined. While such approaches have been effective, it is more desirable to be able to tune the X and Y dimension of the assist feature according to the optical neighbors, especially when utilizing the assist feature generation method discussed above, which can produce assist features having very irregular shapes, such as shown in FIG. 3. Indeed, when utilizing the assist feature generation method of the present invention, it would be quite difficult to use predetermined rules defining the X and Y size limits for the assist features.

In accordance with the second embodiment of the present invention, a model-based method is disclosed for maximizing the size and shape of the assist features within the target pattern. More specifically, utilizing an aerial image analysis each of the assist features is grown until the assist feature reaches a predefined threshold, which is some percentage less than the printing threshold for the given imaging system and process being utilized.

Figure 4:
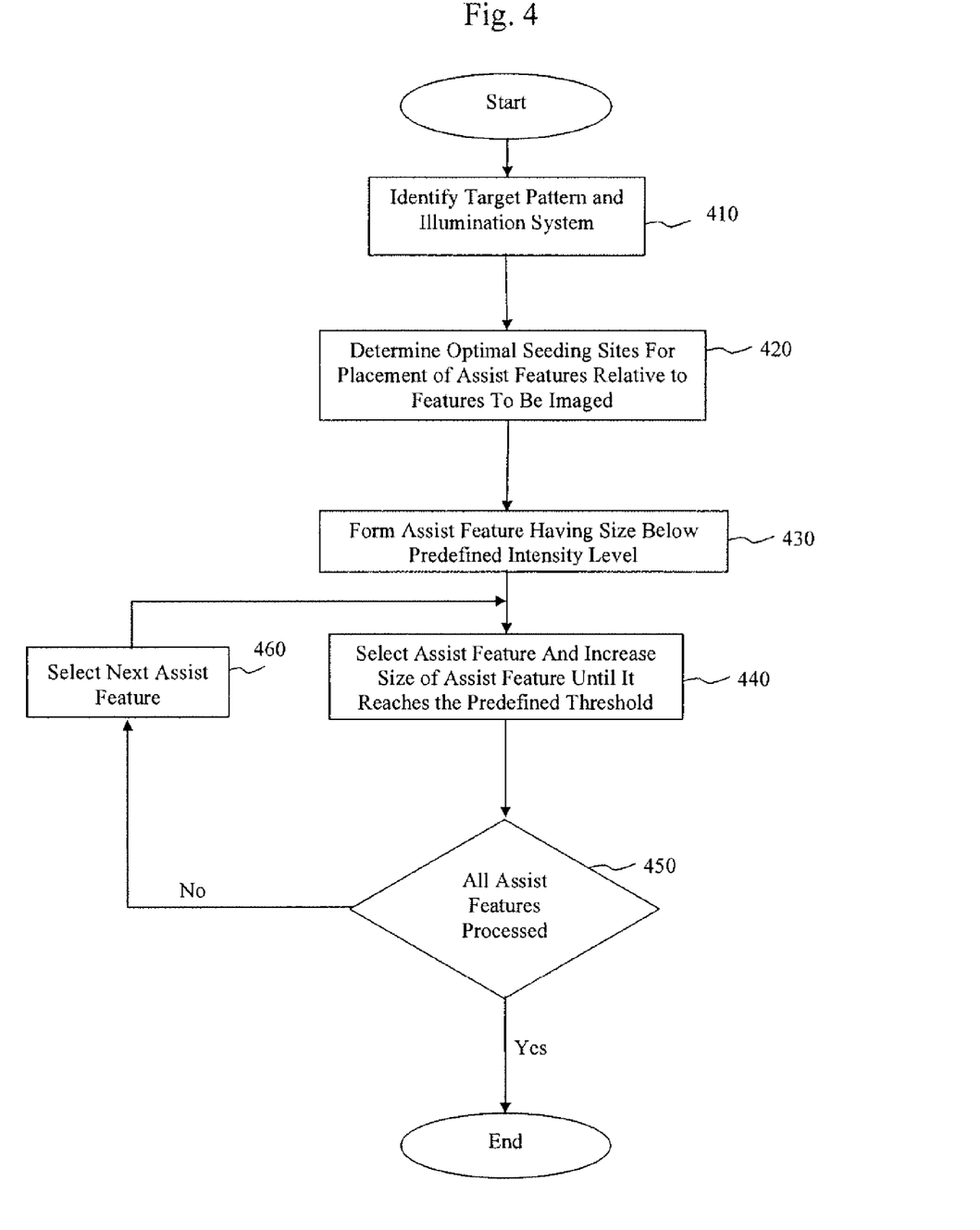
FIG. 4 illustrates an exemplary flowchart illustrating the method of growing the assist features in accordance with the second embodiment of the present invention.

FIG. 4 illustrates an exemplary flowchart illustrating the method of growing the assist features in accordance with the second embodiment of the present invention. The first step (Step 410) in the process is to define the target pattern and the illumination system to be utilized. The next step (Step 420) in the process is to determine the optimal seeding sites for the assist features relative to the features to be imaged. Step 420 can be performed utilizing the process disclosed in the first embodiment of the present invention discussed above. However, it is noted that Step 420 can also be performed utilizing the seeding site identification process disclosed in U.S. Pat. No. 7,247,574. Once the seeding sites have been identified, the next step (Step 430) is to form an assist feature around the seeding sites so that the assist features have a size which is below the predefined threshold.

It is noted that the predefined threshold represents the maximum intensity that any assist feature may have so as to insure that the assist feature will not image on the wafer. Typically, as noted above, the predefined threshold is set at some percentage below the printing threshold for the CD of the target feature. For example, if the nominal printing threshold for the CD target feature is 0.3 (with respect to open-frame exposure intensity), the maximum intensity for assist features (i.e., the predefined threshold) can be set at 0.15, which is well below the printing threshold, As would be understood by those of skill in the art, the predefined threshold utilized in this process is dependent on the imaging system being utilized and the dimensions of the features to be imaged.

Continuing, after completion of Step 430, assist features are positioned about the seeding sites, and the assist features are sized so as to have an initial dimension that results in a corresponding image intensity that is less than the predefined threshold. It is noted that the image intensity of the assist features can be determined utilizing known OPC simulation systems such as MaskWeaver™, offered for sale by ASML MaskTools, Inc.

The next step in the process (Step 440) is to select a first assist feature and increase the size of the assist feature until the image intensity of the given assist feature reaches the predefined threshold. The size of the given assist feature corresponding to the image intensity equaling the predefined threshold defines the size of the given assist feature to be utilized in the mask. Once the maximum size of the first assist feature is determined, the process proceeds to the next assist feature, and increases the size of this assist feature until the image intensity associated with this assist feature equals the predefined threshold. This process is continued until all of the assist features placed in the mask pattern in Step 430 have been processed. This loop is represented by Steps 440, 450 and 460 as shown in FIG. 4. It is noted that the assist features that are more sensitive (i.e., likely to print) will reach the predefined intensity faster than those assist features that are less sensitive, and therefore will have a smaller size relative to the less sensitive assist features in the final mask pattern.

In the given embodiment, the assist features are increased in size utilizing the following process. First, the size of the assist featured is increased in the X direction and the image intensity is monitored. As noted above, the image intensity of the given assist feature can be monitored utilizing OPC simulation software. The size is increased in the X-direction until the X-limit is reached. Once the X-limit is reached, the assist feature is then grown in the Y-direction. In a similar manner, the size of the assist feature is increased in the Y-direction until the Y-limit is reached. hi addition to the sub-resolution requirements, the X-limit and Y-limit are also governed by the amount of space between the target pattern in the design and the minimum distance required between a target pattern and a sub-resolution assist feature. As noted above, the objective is to maximize both the growth in X-direction and the Y-direction but never allow the overall assist feature size and shape to produce the intensity that is exceeding the predefined threshold limit. Also, although the foregoing example illustrates the assist feature being first grown in the X-direction and then grown in the Y-direction, the present invention is not limited to this process. In a variation of the foregoing, it would be possible to first grow the assist feature in the Y-direction, followed by growth in the X-direction, or alternatively, grow both the X and Y dimensions of the assist feature simultaneously.

Figure 5A:
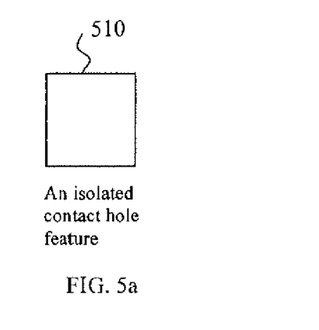
FIG. 5a-5d illustrate an example of applying assist features to a contact hole in accordance with the process of the second embodiment of the present invention.
Figure 5B:
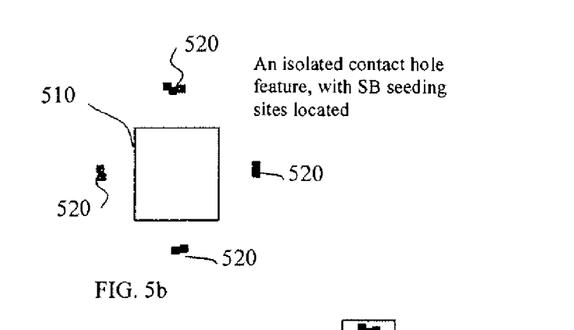
Figure 5C:
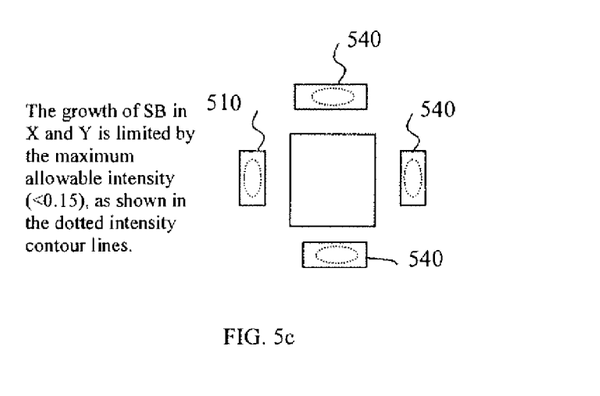
Figure 5D:
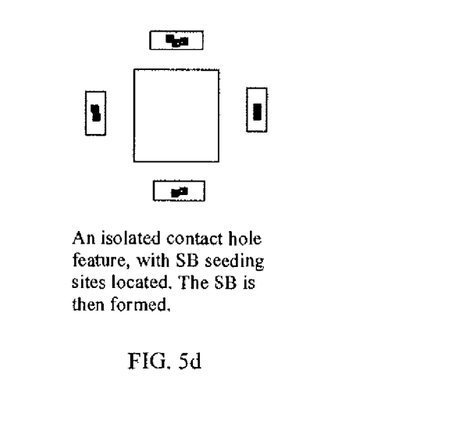

FIGS. 5a-5d illustrate the foregoing process of growing the assist features. More specifically, FIG. 5a illustrates an exemplary contact hole 510 for which assist features will be generated to improve imaging (corresponding to Step 410). FIG. 5b illustrates the seeding sites 520 for placement of assist features determined from the interference map in the manner set forth above (Step 420). FIG. 5c illustrates the initial assist features 540 placed around the seeding sites (Step 430). FIG. 5d illustrates the assist features grown to the maximum size allowable.

Figure 6:
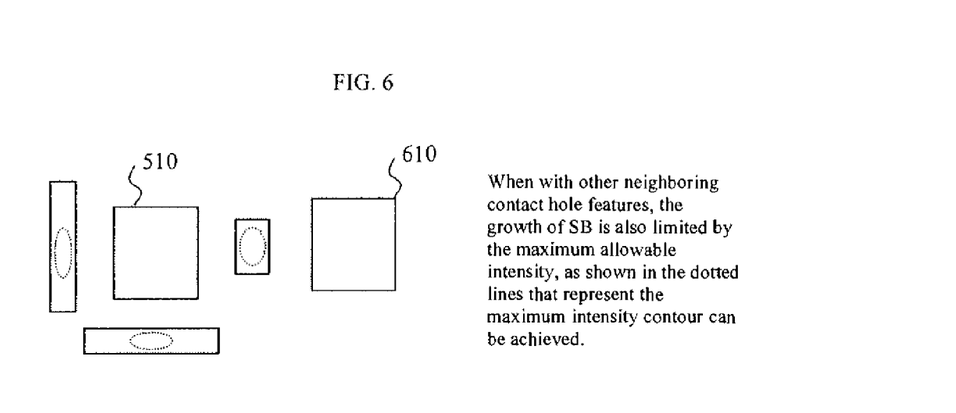
FIG. 6 illustrates an example of how an adjacent feature can effect the growth of a given assist feature.

FIG. 6 illustrates how an adjacent feature can effect (in this instance limit) the growth of a given assist feature. In the given example a second contact hole 610 is added to the pattern shown in FIG. 5a. As a result of this second contact hole 610, the growth of the assist feature 620 disposed between the first contact hole 510 and the second contact hole 610 is limited.

In a third embodiment of the present invention, the interference map is utilized to determine whether the given features in the target pattern represent strong or weak features with respect to imaging performance. More specifically, the interference map is analyzed to determine the intensity of the interference at the locations of the features within the mask. Features located at positions having high levels of interference are considered strong features that will image easily. Alternatively, features located at positions exhibiting reduced levels of interference may exhibit unacceptable imaging results. Once defined, as explained in detail below, additional steps can be taken to ensure acceptable printing of the weak features.

Figure 7:
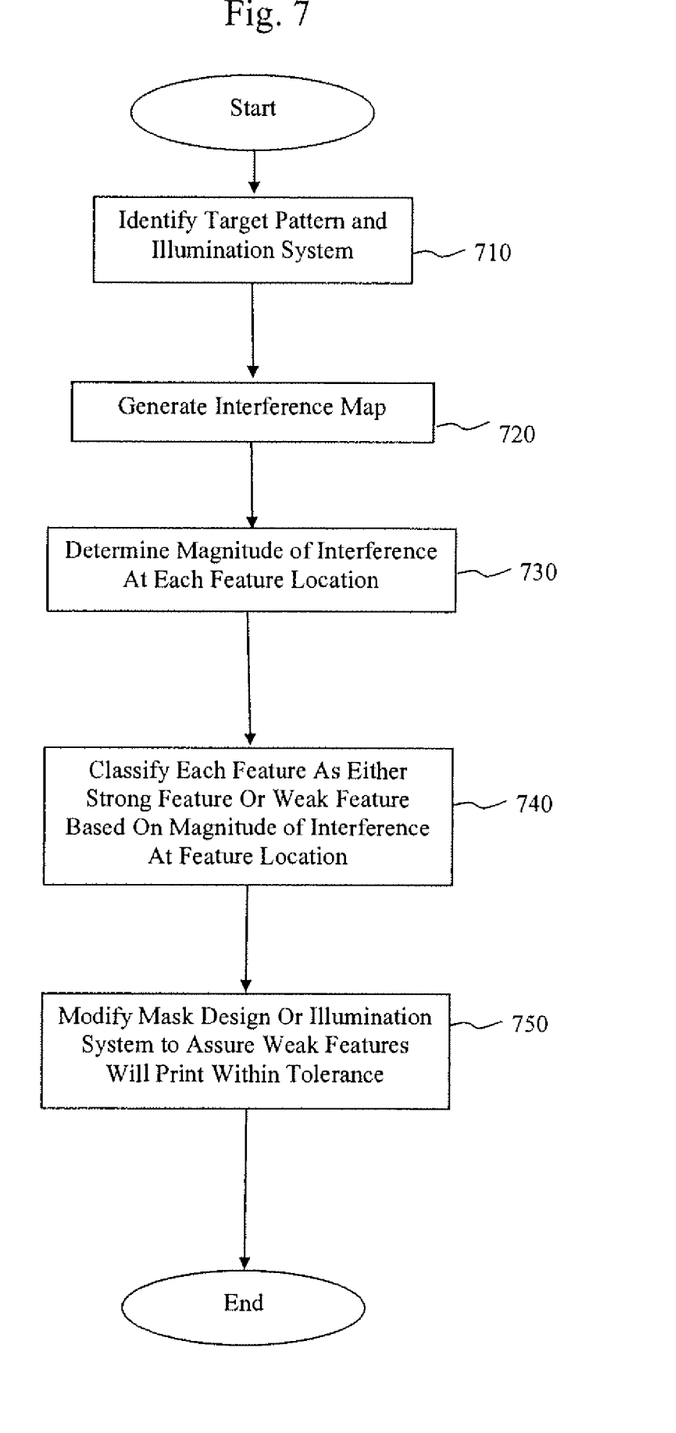
FIG. 7 illustrates a flowchart describing the method of defining features to be imaged as either a weak feature or a strong feature with respect to the imaging process in accordance with a third embodiment of the present invention.

FIG. 7 illustrates a flowchart describing the method of defining features to be imaged as either a weak feature or a string feature with respect to the imaging process. The first step (Step 710) is to define the target pattern and the illumination system to be utilized. The next step (Step 720) in the process is to generate an interference map for the target pattern based on the imaging system and process to be utilized. Thereafter, the interference map is utilized to determine the magnitude of interference at each feature location (Step 730). In the next step (Step 740), each feature to be imaged is defined as either a weak feature or a strong feature based on whether or not the magnitude of interference at the given feature location is above or below a predefined interference value. Those features having an interference magnitude which is greater than the predefined interference value are defined as strong features (and represent features that will print easily), while the features having an interference magnitude less than the predefined interference value are defined as weak features (are represent features that will have difficulty printing). It is noted that the predefined interference value, which is utilized to define whether or not a feature is a strong interference feature or a weak interference feature, can be determined utilizing a process window simulation. For example, assuming the interference map of the target pattern exhibits an interference magnitude ranging from 1.0 to 0.7 at the feature locations (where the magnitudes of interference have been normalized to 1.0), by utilizing the simulation program, such as LithoCruiser™, sold by ASML MaskTools, Inc., it is possible to determine that all features having an interference magnitude greater than 0.8 will print well within tolerance, and those features having an interference magnitude below 0.8 may exhibit. As such, features having an interference magnitude greater than 0.8 are defined as strong features, and features having an interference magnitude below 0.8 are defined as weak features.

Once the features have been defined, additional measures can be taken to ensure that the weak features will print within the process tolerance requirements (Step 750). Such additional measures include, but are not limited to, adjusting the illumination and NA setting; varying the location and/or shape of the weak features within the target pattern; or separating the weak features and the strong features into two separate exposure masks. After performing any of the foregoing adjustments, the process set forth in FIG. 7 can then be repeated to determine if all of the weak features have been eliminated.

Figure 8A:
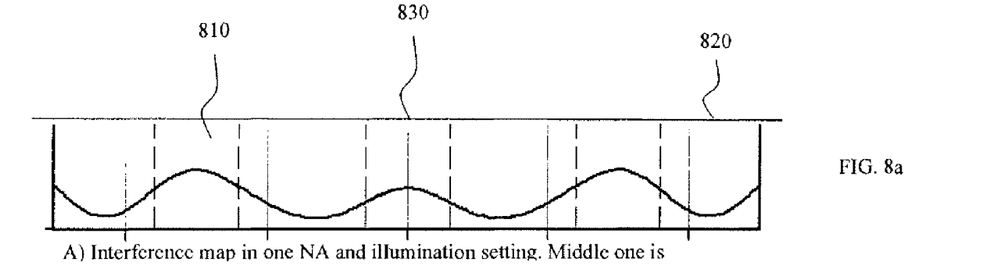
FIG. 8a illustrates an exemplary partial interference map for a given NA and illumination setting.
Figure 8B:
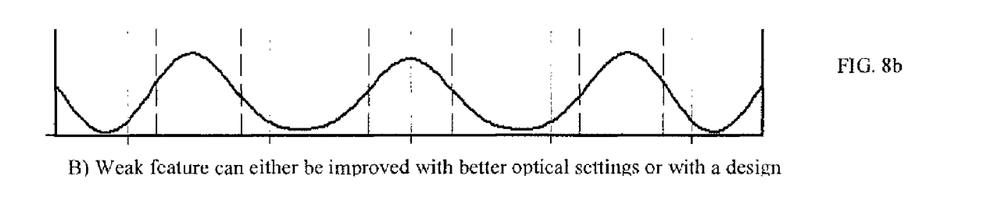
FIG. 8b illustrates the same partial interference map after a correct has been applied to improve imaging performance.

FIGS. 8a and 8b illustrate the use of the interference map for identifying weak and strong features. Specifically, FIG. 8a illustrates a partial interference map for a given NA and illumination setting. As shown, the two outside features 810 and 820 are strong features that will image easily, and the middle feature 830 is a weak feature relative to the two outside features. As such, the middle feature may not image properly. By performing one of the adjustments noted above, it is possible to raise the interference magnitude of the middle feature such that it is a strong feature, as is shown in FIG. 8b.

Figure 9:
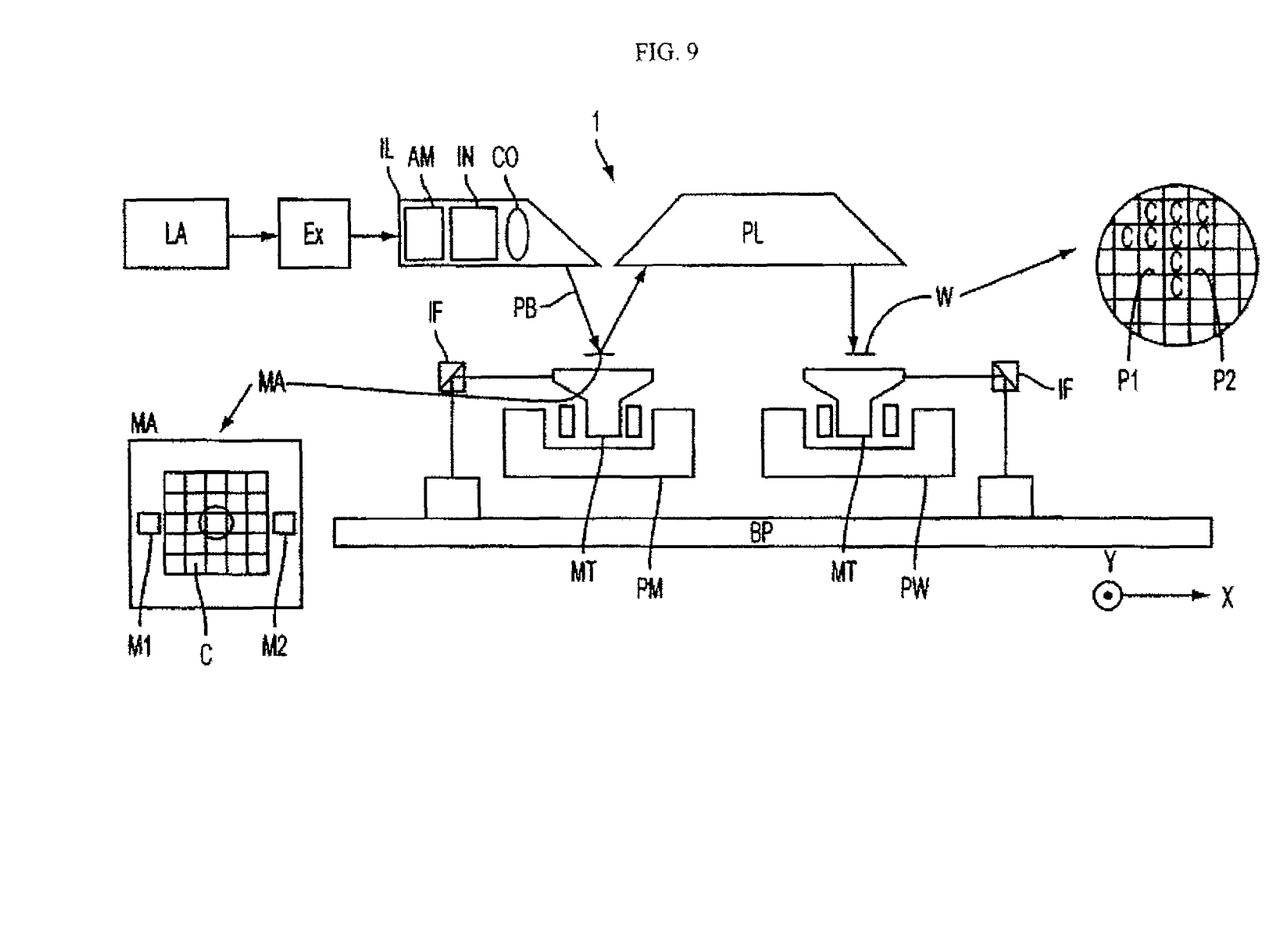
FIG. 9 schematically depicts an exemplary lithographic projection apparatus suitable for use with a mask designed with the aid of the disclosed concepts.

FIG. 9 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as .sigma.-outer and .sigma.-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 9 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Additionally, software may implement or aid in performing the disclosed concepts. Software functionalities of a computer system involve programming, including executable code, may be used to implement the above described imaging model. The software code is executable by the general-purpose computer. In operation, the code, and possibly the associated data records, are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platforms discussed above. Volatile media include dynamic memory, such as main memory of such a computer platform. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, a RAM, a PROM, and EPROM, a FLASH-EPROM, any other memory chip or cartridge, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method, implemented by a computer, of improving imaging performance of a mask pattern having a feature to be imaged, said method comprising the steps of:
   (a) obtaining a model of a lithographic process for imaging said mask pattern onto a substrate;
   (b) determining an optimal setting of said lithographic process to be utilized when imaging said mask pattern;
   (c) determining, using said model, a first interference map based on said mask pattern and said optimal setting;
   (d) determining a first seeding site representing the optimal placement of an assist feature within said mask pattern relative to said feature to be imaged on the basis of said first interference map;
   (e) selecting a plurality of lithographic process settings that represent a predefined amount of variation relative to said optimal setting;
   (f) determining, using said model, a plurality of interference maps respectively based on said mask pattern and said plurality of lithographic process settings;
   (g) determining a plurality of seeding sites representing the optimal placement of an assist feature within said mask pattern relative to said feature to be imaged on the basis of said plurality of interference maps; and
   (h) generating an assist feature having a shape which encompasses both said first seeding site and said plurality of seeding sites,
   wherein one or more of steps (a)-(f) are performed using said computer.

2. The method of claim 1, wherein said optimal setting represents the optimal focus setting for imaging said mask pattern.

3. The method of claim 1, wherein said assist feature has a size such that said assist feature is not imaged on said substrate.

4. The method of claim 1, further comprising the step of placing additional assist features relative to additional features to be imaged within said mask pattern, each of said additional assist features being generated by performing steps (b)-(h).

5. The method of claim 1, wherein said interference maps define areas of constructive interference and areas of destructive interference between said feature to be imaged and a field area adjacent said feature.

6. The method of claim 1, further comprising the steps of:
determining a maximum image intensity level for said assist feature, said maximum image intensity defining an imaging intensity that will not result in the imaging of said assist feature on said substrate; and
adjusting the size of said assist feature such that an image intensity level associated with said assist feature is equal to or less than said maximum image intensity level.

7. The method of claim 4, further comprising the steps of:
determining a maximum image intensity level which defines an imaging intensity that will not result in the imaging of said assist features on said substrate;
initially sizing each of said assist features such that said assist features have an imaging intensity level which is below said maximum image intensity level; and
adjusting the size of each of said assist features such that the image intensity level associated with said each assist feature is equal to or less than said maximum image intensity level.

8. The method of claim 1, wherein said lithographic process settings correspond to focus, and wherein said step of selecting said plurality of lithographic processing settings includes determining a plurality of defocus values in accordance with a numerical aperture of the lithographic process.

9. The method of claim 1, wherein said feature to be imaged has a dimension approximately one quarter of a wavelength of said lithographic process.

10. A computer program product for controlling a computer comprising a non-transitory recording medium readable by the computer, means recorded on the recording medium for directing the computer to perform a method of improving imaging performance of a mask pattern having a feature to be imaged, said method comprising the steps of:
(a) obtaining a model of a lithographic process for imaging said mask pattern onto a substrate;
(b) determining an optimal setting of said lithographic process to be utilized when imaging said mask pattern;
(c) determining, using said model, a first interference map based on said mask pattern and said optimal setting;
(d) determining a first seeding site representing the optimal placement of an assist feature within said mask pattern relative to said feature to be imaged on the basis of said first interference map;
(e) selecting a plurality of lithographic process settings that represent a predefined amount of variation relative to said optimal setting;
(f) determining, using said model, a plurality of interference maps respectively based on said mask pattern and said plurality of lithographic process settings;
(g) determining a plurality of seeding sites representing the optimal placement of an assist feature within said mask pattern relative to said feature to be imaged on the basis of said plurality of interference maps; and
(h) generating an assist feature having a shape which encompasses both said first seeding site and said plurality of seeding sites.

11. The computer program product of claim 10, wherein said optimal setting represents the optimal focus setting for imaging said mask pattern.

12. The computer program product of claim 10, wherein said assist feature has a size such that said assist feature is not imaged on said substrate.

13. The computer program product of claim 10, further comprising the step of placing additional assist features relative to additional features to be imaged within said mask pattern, each of said additional assist features being generated by performing steps (b)-(h).

14. The computer program product of claim 10, wherein said interference maps define areas of constructive interference and areas of destructive interference between said feature to be imaged and a field area adjacent said feature.

15. The computer program product of claim 10, further comprising the steps of:
determining a maximum image intensity level for said assist feature, said maximum image intensity defining an imaging intensity that will not result in the imaging of said assist feature on said substrate; and
adjusting the size of said assist feature such that an image intensity level associated with said assist feature is equal to or less than said maximum image intensity level.

16. The computer program product of claim 13, further comprising the steps of:
determining a maximum image intensity level which defines an imaging intensity that will not result in the imaging of said assist features on said substrate;
initially sizing each of said assist features such that said assist features have an imaging intensity level which is below said maximum image intensity level; and
adjusting the size of each of said assist features such that the image intensity level associated with said each assist feature is equal to or less than said maximum image intensity level.

17. The computer program product of claim 10, wherein said lithographic process settings correspond to focus, and wherein said step of selecting said plurality of lithographic processing settings includes determining a plurality of defocus values in accordance with a numerical aperture of the lithographic process.

18. The computer program product of claim 10, wherein said feature to be imaged has a dimension approximately one quarter of a wavelength of said lithographic process.

19. A device manufacturing method comprising the steps of;
(a) providing a substrate that is at least partially covered by a layer of radiation-sensitive material;
(b) providing a projection beam of radiation using an imaging system;
(c) using a mask pattern having a feature to be imaged to endow the projection beam with a pattern in its cross-section;
(d) projecting the patterned beam of radiation onto a target portion of the layer of radiation-sensitive material,
wherein, in step (c), said mask pattern is optimized by a method comprising the steps of:
obtaining a model of said imaging system for imaging said mask pattern onto said substrate;
determining an optimal setting of said imaging system to be utilized when imaging said mask pattern;
determining, using said model, a first interference map based on said mask pattern and said optimal setting;
determining a first seeding site representing the optimal placement of an assist feature within said mask pattern relative to said feature to be imaged on the basis of said first interference map;

selecting a plurality of imaging system settings that represent a predefined amount of variation relative to said optimal setting;

determining, using said model, a plurality of interference maps respectively based on said mask pattern and said plurality of imaging system settings;

determining a plurality of seeding sites representing the optimal placement of an assist feature within said mask pattern relative to said feature to be imaged on the basis of said plurality of interference maps; and generating an assist feature having a shape which encompasses both said first seeding site and said plurality of seeding sites.

* * * * *